(12) United States Patent
Do

(10) Patent No.: US 7,437,702 B2
(45) Date of Patent: Oct. 14, 2008

(54) METHOD FOR MAKING MASK IN PROCESS OF FABRICATING SEMICONDUCTOR DEVICE

(75) Inventor: Mun Hoe Do, Bucheon (KR)

(73) Assignee: Dongbuanam Semiconductor, Inc., Seoul (KR)

(*) Notice: Subject to any disclaimer, the term of this patent is extended or adjusted under 35 U.S.C. 154(b) by 266 days.

(21) Appl. No.: 11/316,876

(22) Filed: Dec. 27, 2005

(65) Prior Publication Data

US 2006/0141642 A1  Jun. 29, 2006

(30) Foreign Application Priority Data

Dec. 28, 2004  (KR) .................. 10-2004-0114151

(51) Int. Cl.
G06F 17/50 (2006.01)

(52) U.S. Cl. .................. 716/19; 716/21; 430/4

(58) Field of Classification Search ............... 716/4–5, 716/19–21; 430/5
See application file for complete search history.

(56) References Cited

U.S. PATENT DOCUMENTS

| | | | | |
|---|---|---|---|---|
| 6,525,969 | B1 * | 2/2003 | Kurihara et al. ........ | 365/185.25 |
| 6,977,834 | B2 * | 12/2005 | Onizawa et al. ............... | 365/63 |
| 7,207,017 | B1 * | 4/2007 | Tabery et al. .................. | 716/4 |
| 7,275,227 | B1 * | 9/2007 | Ying ............................. | 716/5 |

* cited by examiner

*Primary Examiner*—Vuthe Siek
(74) *Attorney, Agent, or Firm*—McKenna Long & Aldridge LLP

(57) ABSTRACT

A method for making a mask in a process of fabricating a semiconductor device is disclosed, in which one database is classified into an SRAM block and a random logic block so that OPC is separately performed for the SRAM block and the random logic block, thereby improving performance of the OPC. The method includes dividing an input database into an SRAM block and a random logic block, respectively performing optical proximity correction (OPC) for the SRAM block and the random logic block, and combining the SRAM block to the random logic block.

10 Claims, 8 Drawing Sheets

METHOD FOR MAKING MASK IN PROCESS OF FABRICATING SEMICONDUCTOR DEVICE

CROSS-REFERENCE TO RELATED APPLICATION

This application claims the benefit of Korean Patent Application No. 10-2004-0114151, filed on Dec. 28, 2004, which is hereby incorporated by reference as if fully set forth herein.

BACKGROUND OF THE INVENTION

1. Field of the Invention

The present invention relates to a method for making a mask in a process of fabricating a semiconductor device, and more particularly, to a method for improving resolution in photolithography in a process of fabricating a semiconductor device.

2. Discussion of the Related Art

Generally, a photolithographic process relates to a process of forming a pattern and is one of the important processes in fabricating a semiconductor device. Recently, with the high integration of semiconductor devices, precision in the photolithographic process is required. This is because the patterns are a small size for highly integrated semiconductor devices and a process that requires a high precision is required for resolution in the small sized pattern. However, the devices for the photolithographic process often fail to keep up with the small sized pattern. In this respect, to enhance resolution of the small sized pattern and pattern fidelity, resolution enhancement technology (RET) has been developed. Examples of the RET include off axis illumination (OAI), sub-resolution assist features (SRAF), and optical proximity correction (OPC). Among them, OPC has been performed in a process as small as 0.18 μm. Examples of OPC include rule based OPC, model based OPC, and hybrid OPC. Hybrid OPC is based on both rule based OPC and model based OPC. Each OPC is selectively performed depending on what design is handled.

Model based OPC is mainly performed in foundries. As shown in FIG. 1, OPC has been conventionally performed for a static random access memory (SRAM) block 100 and a random logic block 102 without classification. OPC will be described in detail with reference to FIGS. 2 and 3. FIG. 2 illustrates bit cells constituting SRAM, and FIG. 3 illustrates an SRAM block 100. The SRAM block 100 shown in FIG. 3 is configured in such a manner that a plurality of bit cells 10 shown in FIG. 2 are repeatedly arranged. Since the OPC has conventionally been performed for the SRAM block 100 and the random logic block 102 without classification, a problem occurs in that performance of the OPC deteriorates due to the SRAM block 100 formed by the repeated patterns of the bit cells. This problem occurs more seriously with high integration.

SUMMARY OF THE INVENTION

Accordingly, the present invention is directed to a method for making a mask in a process of fabricating a semiconductor device, which substantially obviates one or more problems due to limitations and disadvantages of the related art.

The present invention provides a method for making a mask in a process of fabricating a semiconductor device, in which one database is classified or divided into an SRAM block and a random logic block so that OPC is separately performed for the SRAM block and the random logic block, thereby improving performance of the OPC process.

Additional advantages and features of the invention will be set forth in the description which follows and will become apparent to those having ordinary skill in the art upon examination of the following. These and other advantages of the invention may be realized and attained by the structure particularly pointed out in the written description and claims hereof as well as the appended drawings.

To achieve these and other advantages and in accordance with the purpose of the invention, as embodied and broadly described herein, a method for making a mask in a process of fabricating a semiconductor device includes classifying or dividing an input database into an SRAM block and a random logic block, respectively performing optical proximity correction (OPC) for the SRAM block and the random logic block, and combining the SRAM block to the random logic block.

The step of performing OPC for the SRAM block includes extracting target bit cell from the SRAM block, performing OPC for the extracted target bit cell, and repeatedly arranging the corrected target bit cell to reform the SRAM block.

In another exemplary embodiment of the present invention, the step of performing OPC for the SRAM block includes extracting target bit cell from the SRAM block, connecting dummy bit cells to one side of the extracted target bit cell, performing OPC for the target bit cell and the dummy bit cell, removing the dummy bit cell from the target bit cell, and repeatedly arranging the corrected target bit cell to reform the SRAM block.

In this case, the dummy bit cell can have layers different from those of the target bit cell. The target bit cell can have one connecting portion. The dummy bit cell can have one connecting portion.

In another exemplary embodiment of the present invention, the step of performing OPC for the SRAM block includes extracting target bit cell from the SRAM block, connecting dummy bit cells to both sides of the extracted target bit cell, performing OPC for the target bit cell and the dummy bit cells, removing the dummy bit cells from the target bit cell, and repeatedly arranging the corrected target bit cell to reform the SRAM block.

In this case, the dummy bit cells and the target bit cell respectively can have layers different from one another. The dummy bit cells can have the same layers as one another, and can have layers different from those of the target bit cell.

The target bit cell can have connecting portions at both sides. The dummy bit cells can have connecting portions at both sides.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention, illustrate exemplary embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A method for making a mask in a process of fabricating a semiconductor device according to one embodiment of the present invention will be described with reference to FIG. 4 to FIG. 6.

Figure 1:
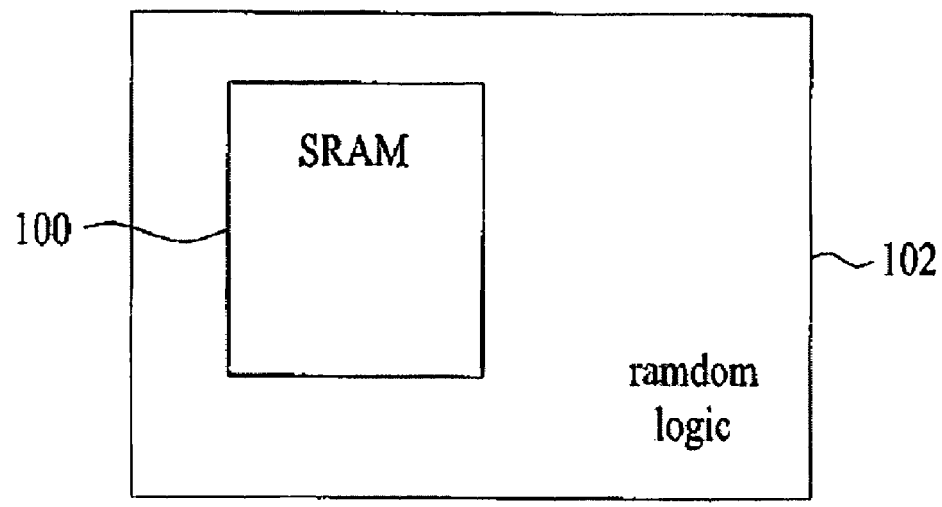
FIG. 1 illustrates an input database having an SRAM block and a random logic block.
Figure 2:
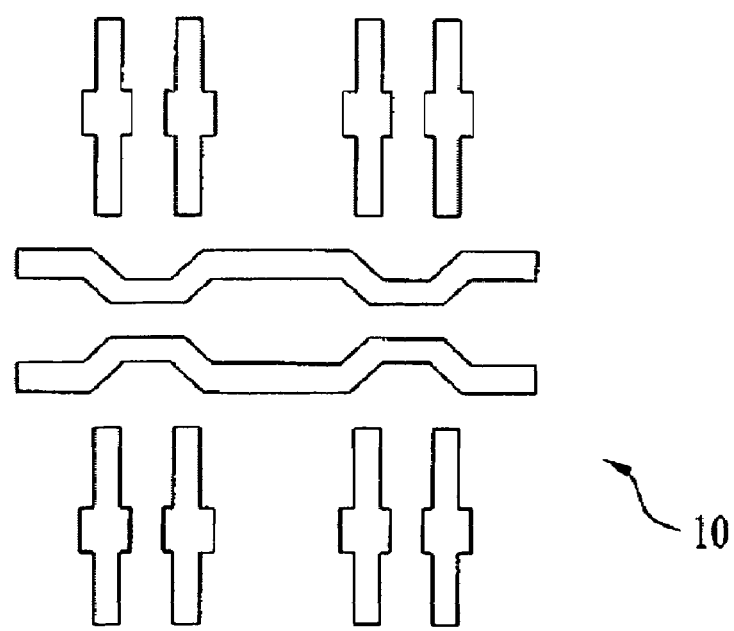
FIG. 2 illustrates bit cells constituting the SRAM block shown in FIG. 1.
Figure 3:
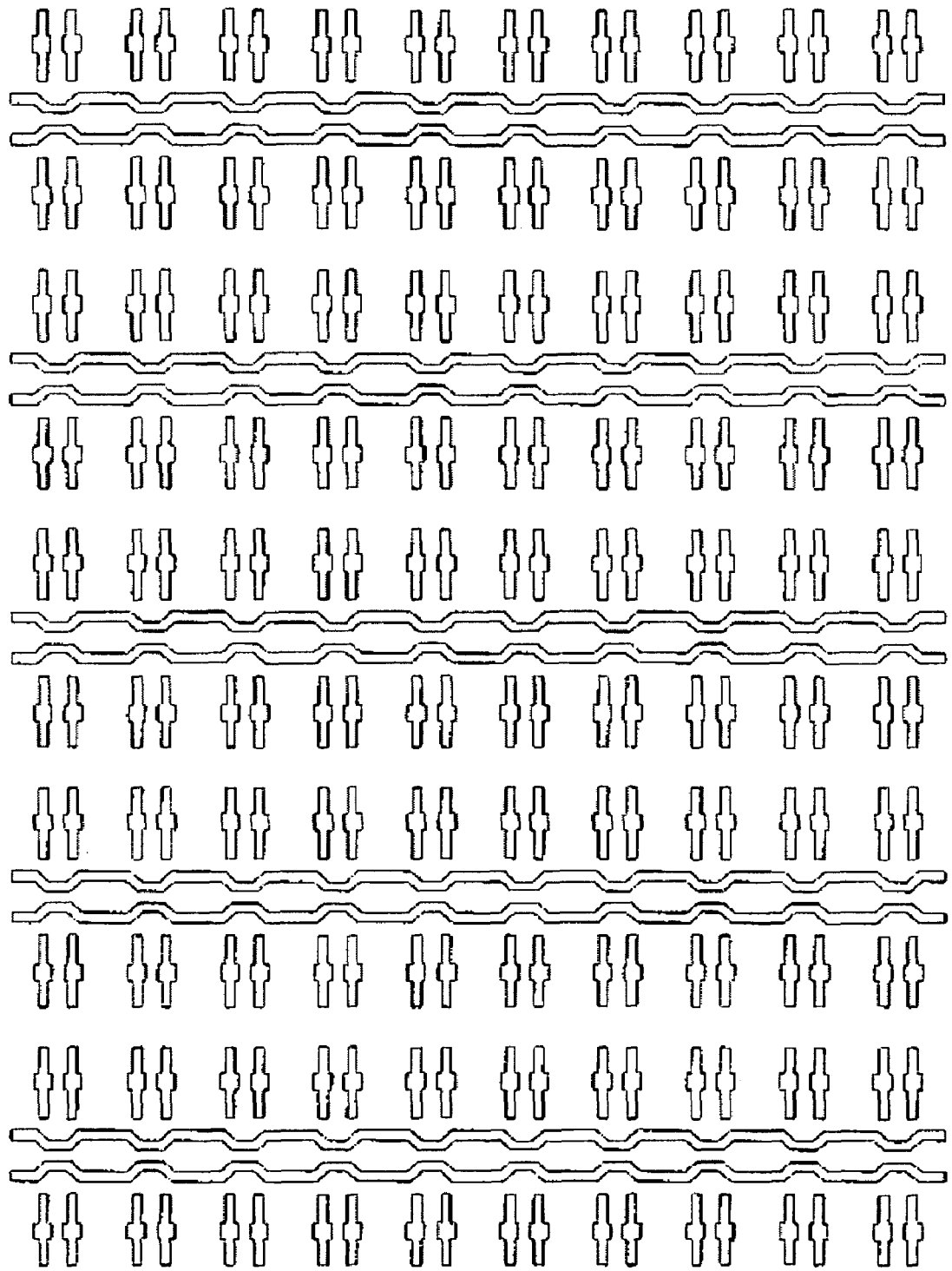
FIG. 3 illustrates the SRAM block formed by the bit cells shown in FIG. 2.
Figure 4:
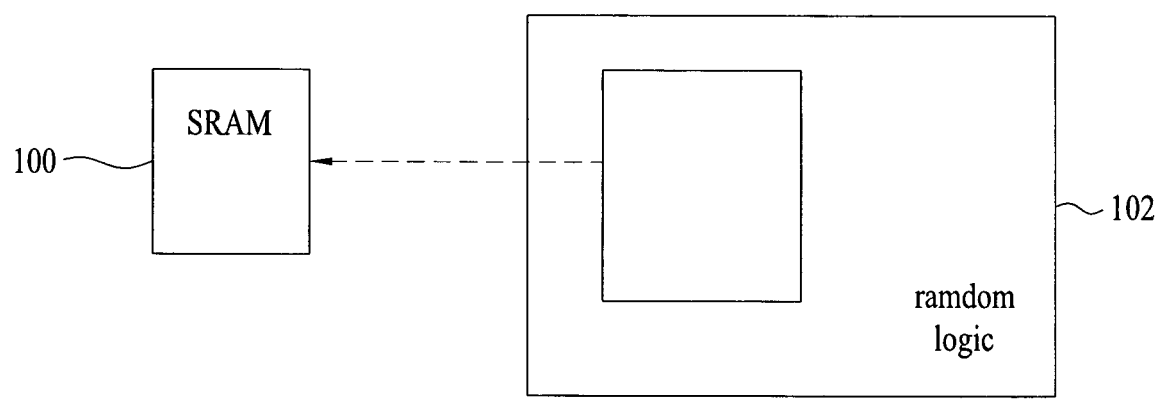
FIG. 4 illustrates an SRAM block and a random logic block classified from an input database shown in FIG. 3 in accordance with one exemplary embodiment of the present invention.

First, as shown in FIG. 4, one input database is divided into an SRAM block 100 and a random logic block 102. Then, target bit cell 10 as shown in FIG. 2 are extracted from the SRAM block 100, and OPC is performed for the extracted target bit cell 10. More than one target bit cell 10 can undergo OPC 10. The result from the OPC process for the extracted target bit cells 10 is shown in FIG. 5.

Figure 6:
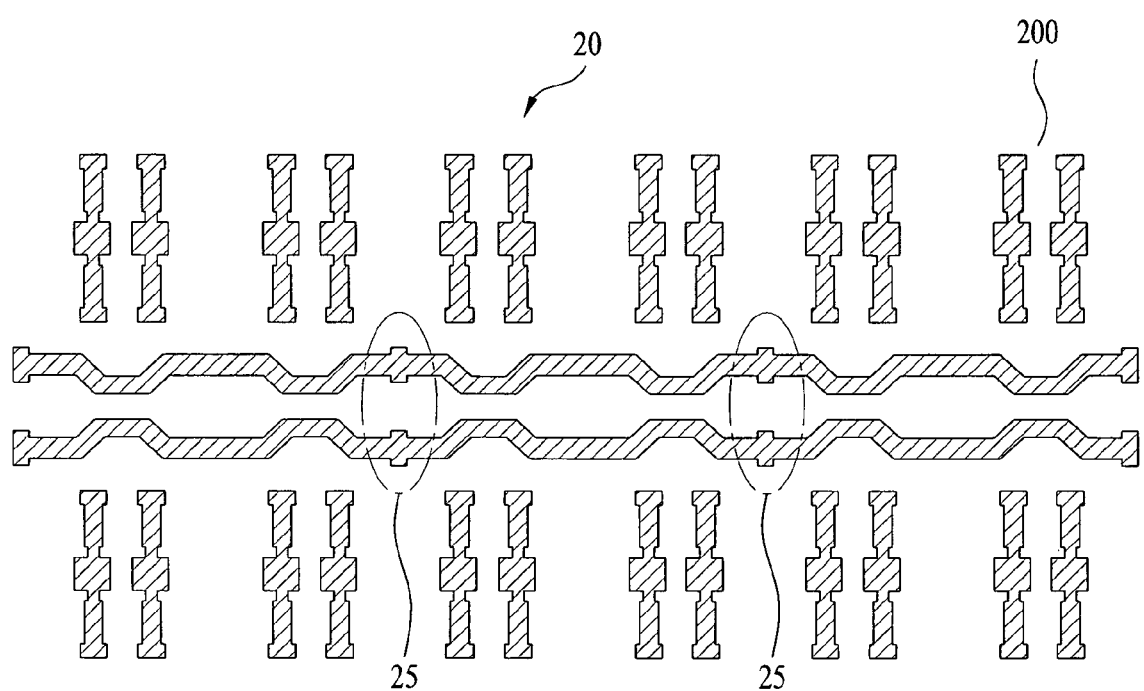
FIG. 6 illustrates the SRAM block formed by repeated arrangement of the bit cells shown in FIG. 5.

Referring to FIG. 6, target bit cells 20 in which OPC has been performed are repeatedly arranged to reform an SRAM block 200. A random logic block (not shown) in which OPC has been performed is added to the SRAM block 200.

In other words, the input database is divided into the SRAM block 100 and the random logic block 102 so that OPC is separately performed for the SRAM block 100 and the random logic block 102, thereby improving performance of the OPC.

Figure 5:
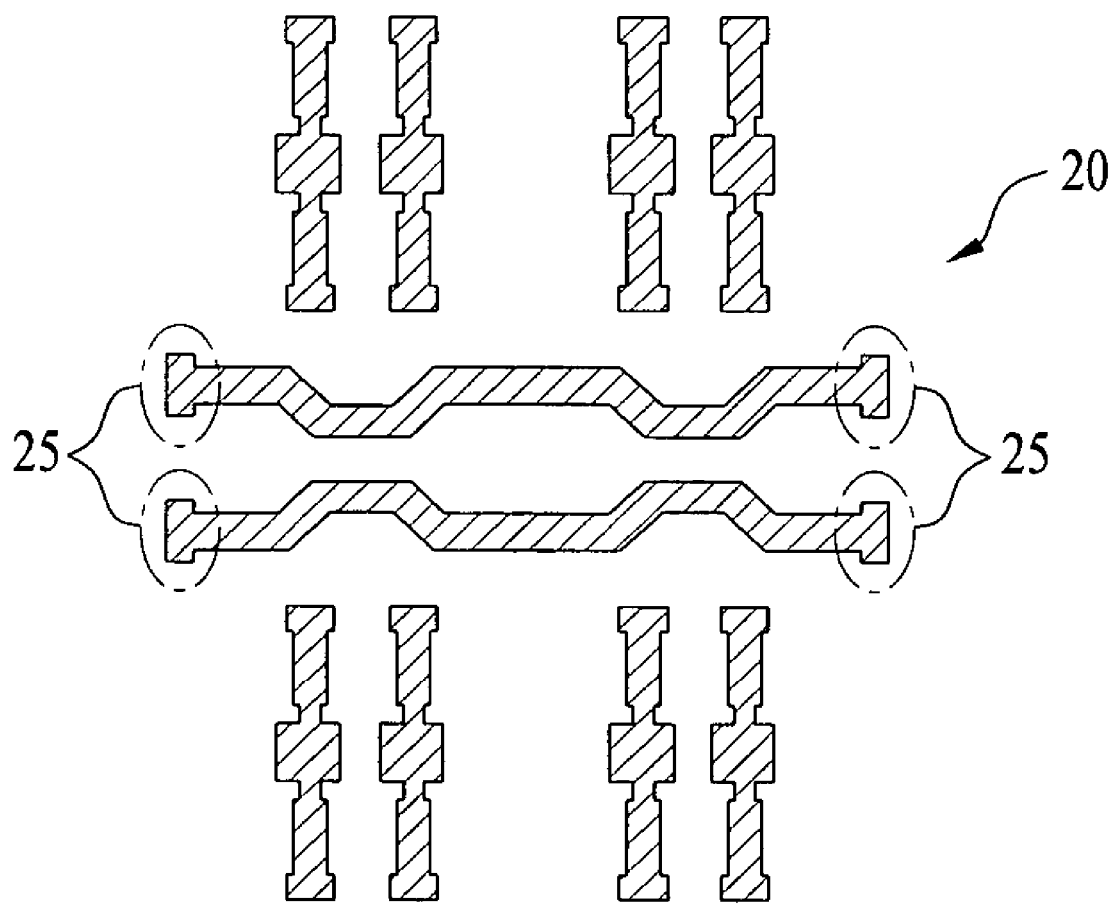
FIG. 5 illustrates the result that OPC has been performed for the bit cells of FIG. 1.

However, although performance of the OPC is improved in the above embodiment, OPC is performed for a line end portion 25 of the target bit cell 20 as shown in FIG. 5. If the target bit cells 20 in which OPC has been performed are repeatedly arranged to form the SRAM block 200, undesired OPC is performed for the line end portion 25 where the target bit cells 20 are connected to one another. That is, OPC is performed for an undesired portion, i.e., the line end portion 25, as the line end portion 25 is recognized as some of an extension line without being recognized as the line end.

In the another exemplary embodiment of the present invention, dummy bit cells are provided at both sides of the target bit cell 20 so as to perform OPC for only the target bit cell 20, excluding the line end portion 25 of the target bit cell 20. This will be described in detail with reference to FIG. 7 to FIG. 9.

Figure 7:
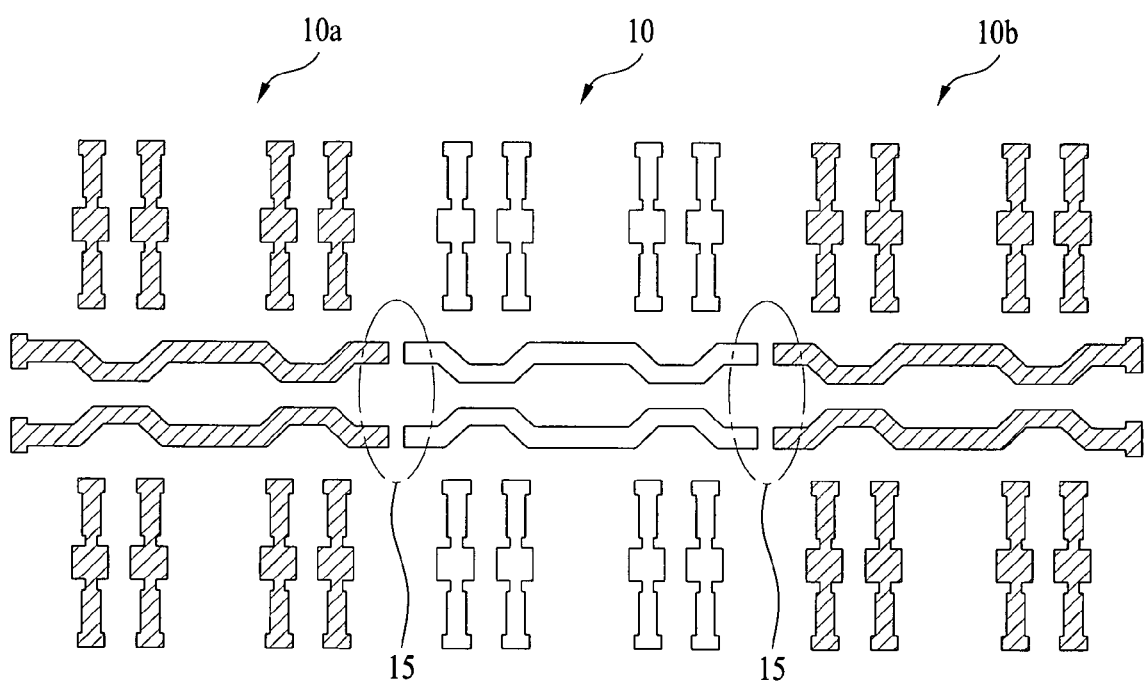
FIG. 7 illustrates bit cells connected with dummy bit cells in accordance with another exemplary embodiment of the present invention.

First, the target bit cells 10 are extracted from the SRAM block 100. Then, as shown in FIG. 7, dummy bit cells 10a and 10b are connected to both sides of the extracted target bit cell 10. In the exemplary embodiment of the present invention, to easily remove the dummy bit cells 10a and 10b from the target bit cell 10 after OPC, the dummy bit cells 10a and 10b have layers different from those of the target bit cell 10. At this time, the dummy bit cells 10a and 10b have layers different from those of the target bit cell 10, but may have the same layers as one another. Alternatively, the bit cells 10, 10a and 10b may have different layers from one another.

Furthermore, to connect the dummy bit cells 10a and 10b to the target bit cell 10, the target bit cells 10 have connecting portions at both sides. However, since the dummy bit cells 10a and 10b are connected to any one side of the target bit cell 10, the connecting portion may be formed on either side.

Next, OPC is simultaneously performed for the target bit cell 10 and the dummy bit cells 10a and 10b. In this case, if OPC is performed for only the target bit cell 10, it is possible to prevent OPC from being performed for the line end portion 25.

Figure 8:
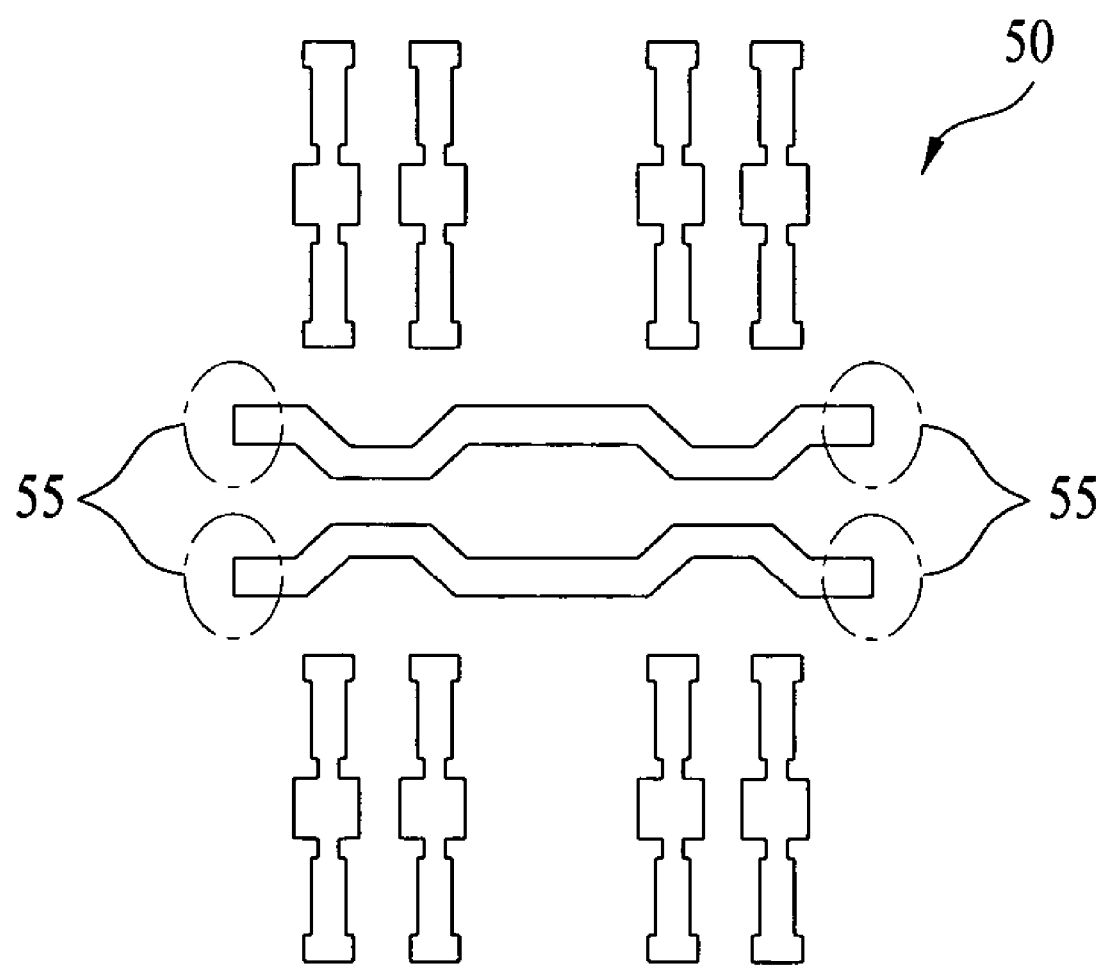
FIG. 8 illustrates the bit cells for which OPC has been performed and from which the dummy bit cells have been removed.

Referring to FIG. 8, after OPC is performed for the target bit cell 10 and the dummy bit cells 10a and 10b, the dummy bit cells 10a and 10b are removed from the target bit cell 10. It is noted that OPC has not been performed for both sides 55 of target bit cell 50 shown in FIG. 8, unlike the target bit cell 20 shown in FIG. 6.

Figure 9:
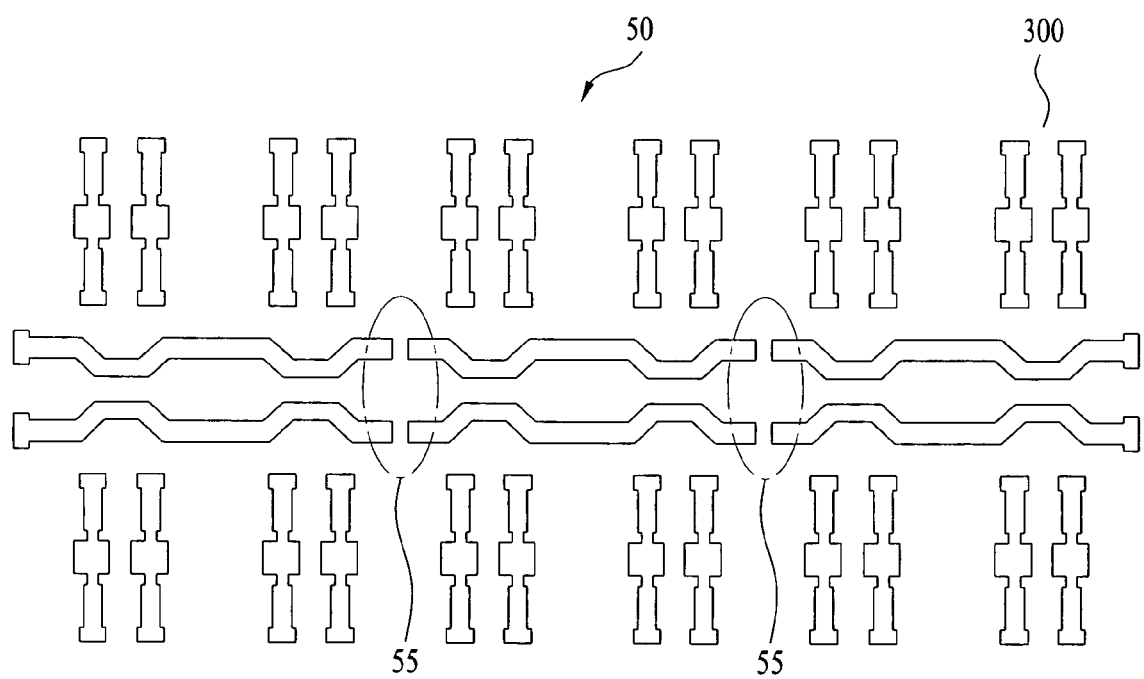
FIG. 9 illustrates the SRAM block formed by repeated arrangement of the bit cells shown in FIG. 8.

Afterwards, as shown in FIG. 9, the target bit cells 50 in which OPC has been performed are repeatedly arranged to reform the SRAM block 200. Unlike the SRAM block 200 shown in FIG. 6, in the SRAM block 300 shown in FIG. 9, OPC is not performed for the portions 55 where the respective target bit cells 50 are connected to each other.

Finally, the reformed SRAM block 300 is connected to a random logic block (not shown) in which OPC has been performed.

In the aforementioned exemplary embodiment, the dummy bit cells are connected to both sides of the target bit cell. In another exemplary embodiment, the dummy bit cells may be connected to only one side of the target bit cell. In this case, the dummy bit cells can have layers different from those of the target bit cell. If the target bit cell are connected to one dummy bit cell, a connecting portion may be formed only at either side of the target bit cell.

In the present invention, since one database is divided into the SRAM block and the random logic block so as to separately perform OPC for the SRAM block and the random logic block, it is possible to improve performance of the OPC. As a result, it is possible to maximize pattern fidelity and reduce the turn around time (TAT) required for the manufacture of the mask.

In addition, since OPC is simultaneously performed for the target bit cell and the dummy bit cells after the dummy bit cells are connected to the target bit cell, it is possible to prevent OPC from being performed for the portion where the respective target bit cell are connected to each other when the SRAM block is formed.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for making a mask in a process of fabricating a semiconductor device comprising the step of:

dividing an input database into an SRAM block and a random logic block;

extracting a target bit cell from the SRAM block and performing optical proximity correction (OPC) for the extracted target bit cell to correct the target bit cell;

repeatedly arranging the corrected target bit cell to reform the SRAM block;
respectively performing OPC for the random logic block; and
combining the reformed SRAM block and the random logic block in which OPC is performed for the mask making.

2. A method for making a mask in a process of fabricating a semiconductor device comprising the step of:
dividing an input database into an SRAM block and a random to is block;
extracting a target bit cell from the SRAM block;
connecting dummy bit cell to one side of the extracted target bit cell;
performing OPC for the target bit cell and the dummy bit cell to correct the target bit cell;
removing the dummy bit cell from the target bit cell; and repeatedly arranging the corrected target bit cell to reform the SRAM block;
performing OPC for the random to is block; and
combining the reformed SRAM block and the random logic block in which OPC is performed for the mast making.

3. The method as claimed in claim 2, wherein the dummy bit cell has layers different from those of the target bit cell.

4. The method as claimed in claim 2, wherein the target bit cell has one connecting portion.

5. The method as claimed in claim 2, wehrein the dummy bit cell has one connecting portion.

6. A method for making a mask in a process of fabricating a semiconductor device comprising the step of
dividing an input database into an SRAM block and a random logic block;
extracting a target bit cell from the SRAM block;
connecting dummy bit cells to both sides of the extracted target bit cell;
performing OPC for the target bit cell and the dummy bit cells to correct the target bit cell;
removing the dummy bit cells from the target bit cell; and
repeatedly arranging the corrected target bit cell to reform the SRAM block;
performing optical proximity correction (OPC) for the random logic block; and
combining the reformed SRAM block and the random logic block in which OPC is performed for the mask making.

7. The method as claimed in claim 6, wherein the dummy bit cells and the target bit cell respectively have layers different from one another.

8. The method as claimed in claim 6, wherein the dummy bit cells have the same layers as one another, and have layers different from those of the target bit cell.

9. The method as claimed in claim 6, wherein the target bit cell has connecting portions at both sides.

10. The method as claimed in claim 6, wherein the dummy bit cells have connecting portions at both sides.

\* \* \* \* \*